United States Patent
Choi

[19]

[11] Patent Number: 6,118,696

[45] Date of Patent: *Sep. 12, 2000

[54] MULTI-BIT MEMORY CELL ARRAY OF A NON-VOLATILE SEMICONDUCTOR MEMORY DEVICE AND METHOD FOR DRIVING THE SAME

[75] Inventor: Jung-Dal Choi, Suwon, Rep. of Korea

[73] Assignee: Samsung Electronics, Co., Ltd., Suwon, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 09/305,239

[22] Filed: May 4, 1999

Related U.S. Application Data

[63] Continuation of application No. 08/932,452, Sep. 18, 1997, Pat. No. 5,923,587.

[30] Foreign Application Priority Data

Sep. 21, 1996 [KR] Rep. of Korea ................... 96-41483

[51] Int. Cl.[7] .................................. G11C 16/04
[52] U.S. Cl. ................... 365/185.11; 365/185.13; 365/185.17
[58] Field of Search .............. 365/185.11, 185.13, 365/185.17, 185.01, 185.05, 185.07

[56] References Cited

U.S. PATENT DOCUMENTS

| | | | |
|---|---|---|---|
| 4,962,481 | 10/1990 | Choice et al. | 365/185.13 |
| 5,295,096 | 3/1994 | Nakajima | 365/218 |
| 5,392,248 | 2/1995 | Truong et al. | 365/185.13 |
| 5,440,509 | 8/1995 | Momodomi et al. | 365/185.13 |
| 5,448,517 | 9/1995 | Iwahashi | 365/185.17 |
| 5,524,094 | 6/1996 | Nobukata et al. | 365/185.17 |
| 5,568,421 | 10/1996 | Aritome | 365/185.11 |
| 5,572,464 | 11/1996 | Iwasa | 365/185.17 |
| 5,587,948 | 12/1996 | Nakai | 365/185.17 |
| 5,596,526 | 1/1997 | Assar et al. | 365/185.17 |
| 5,621,684 | 4/1997 | Jung | 365/185.17 |
| 5,661,682 | 8/1997 | Lim et al. | 365/185.17 |
| 5,734,609 | 3/1998 | Choi et al. | 365/185.17 |

*Primary Examiner*—Richard Elms
*Assistant Examiner*—Tuan T Nguyen
*Attorney, Agent, or Firm*—Marger Johnson & McCollom, P.C.

[57] ABSTRACT

A memory cell array of a non-volatile semiconductor memory device includes unit strings grouped into first strings belonging to a first string group and second strings belonging to a second string group. Each unit string has a memory cells for storing data in a non-volatile state. Each first string is coupled between an associated bit line of a first bit line group and a first common source line whereas each second string is coupled between an associated bit line of a second bit line group and a second common source line. The bit lines and the common source lines are made of different conductive layers. In accordance with the invention, it is possible to achieve a less critical layout of sense amplifiers coupled to bit lines while easily performing a photolithography process as required in the manufacture of the memory device.

3 Claims, 8 Drawing Sheets

MULTI-BIT MEMORY CELL ARRAY OF A NON-VOLATILE SEMICONDUCTOR MEMORY DEVICE AND METHOD FOR DRIVING THE SAME

This application is a continuation of U.S. patent application Ser. No. 08/932,452, filed on Sep. 18, 1997, incorporated herein by reference.

BACKGROUND OF THE INVENTION

1. Field of Invention

The present invention relates to non-volatile semiconductor memories, and more particularly to a memory cell array of a multi-bit non-volatile memory device configured to store multi-state bit information in each memory cell thereof. The present invention also relates to a method for driving such a multi-bit non-volatile memory device.

2. Description of the Related Art

Generally, non-volatile semiconductor memories are mainly classified into a mask ROM, an EPROM, an EEPROM, and a flash-EEPROM. In particular, EEPROM's have recently been highlighted as a permanent memory for personal notebook computers or as a recording medium for portable terminal devices such as digital cameras and memory cards because they have characteristics capable of electrically converting information and flash-erasing stored data while consuming a small amount of electric power.

In such typical non-volatile semiconductor memories, memory cells thereof can maintain only one of two information storage states, namely, "ON" and "OFF" states. The ON or OFF state of each memory cell defines information of one bit. Accordingly, where a memory device is required to store data of N (N is a natural number not less than 2) bits, it requires N independent memory cells. When an increase in the number of bits of data to be stored in a memory device consisting of one-bit memory cells is required, the number of the memory cells should increase correspondingly. Information stored in each one-bit memory cell is determined in accordance with a programmed status of the memory cell. The information storage states of memory cells are determined in accordance with a difference in threshold voltage among the memory cells (the threshold voltage is a minimum voltage to be applied between the gate and source of a cell transistor included in each memory cell in order to switch the cell transistor to its ON state). In mask ROM's, such a difference in threshold voltage is appropriately programmed using an ion implantation technique in the fabrication of the devices.

On the other hand, in the case of EPROM's, EEPROM's or flash-EEPROM's, a difference in threshold voltage among memory cells is obtained by storing floating gates, respectively included in the memory cells, with different amounts of charge. Generally, each memory cell transistor has two gates disposed over a drain-source channel region. The upper gate is called the "control gate". A charge storage layer is surrounded by an insulating material between the control gate and channel region. This charge storage layer is called the "floating gate". As the amounts of charge stored in floating gates of memory cells differ from one another, as mentioned above, the threshold voltage of the memory cells also differ from one another. Accordingly, the states of information stored in the memory cells are distinguished from one another. In this regard, when the information stored in the cell is to be read, it is necessary to check the programmed information storage status of the memory cell. To this end, signals required to select a desired memory cell and to read information stored in the memory cell are applied to the circuits associated with the memory cell using a decoder circuit. As a result, a current or voltage signal corresponding to the information storage status of the memory cell is obtained on a bit line associated with the memory cell. Accordingly, it is possible to determine the status of the information stored in the memory cell by measuring the obtained current or voltage signal.

Memory cell array configurations of such memory devices are mainly classified into a NOR type and a NAND type. In the case of NOR-type cell arrays, each memory cell is coupled between a bit line and a ground line. In the case of NAND-type cell arrays, a plurality of memory cells are connected in series between a bit line and a ground line. In the technical field, memory cells, which are connected in series to a bit line, along with select transistors (each select transistor is arranged between a corresponding memory cell and the associated bit line, or between each memory cell and the associated ground line) constitute a string. In the case of a NAND-type memory device, which has a greater density than NOR-type memory devices, the select transistors included in a selected string must be in an ON state when the status of information stored in the memory device is to be read. In this case, the control gates of memory cells unselected in the selected string are supplied with a voltage higher than the voltage applied to the control gates of selected memory cells. As a result, the unselected memory cells exhibit an equivalent resistance value lower than that exhibited in the selected memory cells. Therefore, current flowing through the selected string from the associated bit line depends on the status of information stored in the selected memory cells of the string. The voltage or current exhibited on the bit line, in accordance with the status of information stored in the selected memory cells, is sensed by a sense amplifier which is called a "sensing circuit".

Various proposals have been made to increase the storage capacity of memory devices without an increase in chip size. One proposal is to provide a technique for storing information of at least two bits per memory cell. In such two-bit memory cells, the status of information stored in each memory cell maybe one of "00", "01", "10" and "11". In a multi-bit memory device consisting of memory cells each capable of storing two bits, each memory cell is programmed to have a threshold voltage determined as one of four different values. Accordingly, such a multi-bit memory device can store two bits in the same area as a one-bit memory device while using the number of memory cells corresponding to half the number of memory cells required in the one-bit memory device for that amount of information. Therefore, the chip size is correspondingly reduced for storage of a given amount of information, as compared to the one-bit memory device. As the number of bits stored per memory cell increases, the capacity of the multi-bit memory device increases correspondingly as compared to that of the one-bit memory device.

The most important factor for realizing success in the use of such multi-bit non-volatile memory cells is obtaining an accurate distribution of threshold voltages for memory cells. In other words, where memory cells are desired to have states of "00", "01", "10" and "11", respectively, their threshold voltages should correspond, for example, to: 2.5V, 1.5V, 0.5V and −3V, respectively. To this end, the use of a verification mode is required. Even in the case of typical one-bit memory devices, a verification operation is successively carried out after the execution of a programming operation or the completion of an erase operation in order to prevent a dispersion of threshold voltages for memory cells caused by an over-programming, an over-erase, an insufficient programming, or an insufficient erase. The verification mode checks whether the threshold voltage reaches a target threshold voltage value after the execution of a programming or an erase operation. This verification operation is achieved by checking the state of the memory cell in a manner similar to an operation of reading data. Such a technique is disclosed in "Journal of Solid State Circuits" in 1991, pp. 492 to 495. In accordance with this technique, a programming or erase operation is executed again in a verification mode for checking the threshold voltage of a memory cell. The verification of a programming or erasing, executed for memory cells, is achieved by applying signals having the form of voltage to word lines, bit lines and associated lines, thereby sensing current induced on the bit lines in accordance with threshold voltage of the memory cells.

Unfortunately, NAND type memory cell structures have several problems resulting in variation of cell currents due to their structures. For example, in a memory cell structure wherein a plurality of cell strings share one source line, the memory cells have different distances from the associated contacts of the source line, respectively. Such a difference in distance may result in a difference in source line resistance among the memory cells. This causes a difference in the amounts of current flowing through the memory cells. As a result, variation in the threshold voltages of the memory cells occurs. In the case of a multi-bit memory device having a limited level margin, such a difference in cell current, caused by the difference in source line resistance, may cause a problem in that the above-mentioned verification may be impossible. In this case, accordingly, an erroneous operation may be carried out.

Another problem results where a specific bit line is selected, and a capacitive coupling occurs between the selected bit line and a bit line adjacent to the selected bit line. Due to such a capacitive coupling, the bit line voltage of each memory cell varies irrespective of the actual state of the memory cell. As a result, an erroneous operation occurs. For instance, where a memory cell, which is in its ON state, is selected, its bit line voltage decreases. When an "OFF" cell, which is adjacent to an "ON" cell, is selected, it is theoretical that the bit line voltage of the "OFF" cell is high as compared to that of the "ON" cell. Practically, however, the bit line voltage of the "OFF" cell decreases due to a capacitive coupling occurring between adjacent bit lines respectively associated with the "OFF" and "ON" cells. As a result, there is an erroneous verification in that the "OFF" cell is verified as an "ON" cell. Such a phenomenon occurs frequently in a semiconductor memory device which has an increased bit line area for obtaining an increase in memory capacity. This phenomenon occurs more frequently in a semiconductor memory device which has a reduced cell size resulting in a decrease in the distance between adjacent bit lines.

Taking these problems into consideration, various proposals have been made to solve the variations among threshold voltages for memory cells caused by the source line resistance difference among the memory cells and the capacitive coupling phenomenon occurring between adjacent bit lines. One proposal is disclosed in "Symposium on VLSI Circuits Digest of the Technical Papers" in 1995, pp. 69 to 70. In accordance with that technique, string select transistors, each programmed to have two threshold voltages, are arranged beneath bit line contacts, respectively. Bit lines of adjacent strings are connected in common to a bit line contact. Of the two bit lines, one, which is selected in an operation mode, is connected to a sense amplifier called a "page buffer" whereas the other bit line, which is unselected in the operation mode, is coupled to the ground voltage or placed in a float state. Accordingly, the unselected bit line is used as a source line. In this case, it is possible to obtain a very small source line resistance because the source line resistance is based on only the resistance of a metal material forming source lines. By virtue of this very small source line resistance, the unselected bit line adjacent to the selected bit line is maintained at the ground level. As a result, the above-mentioned capacitive coupling problem can be substantially solved.

However, the above-mentioned technique involves other problems. For example, in accordance with this technique, the layout of sense amplifiers coupled to bit lines is complex because the metal pitch of the bit lines is short as in typical one-bit NAND memory structures. Such a reduced metal pitch results in a difficulty in the execution of a photolithograpy process required in the manufacture of the desired memory devices. Furthermore, an additional masking process must be carried out to separately fabricate string select transistors, each programmed to have two threshold voltages. The string select transistors fabricated using the additional process have threshold voltages of 2V or more. As a result, there is a problem in that a reduction in string current, during a read operation, occurs. Moreover, voltage of 1.5V is applied to the gate of each string select transistor in a programming operation in accordance with the above-mentioned technique. As a result, there is a problem in that a program disturbance phenomenon occurs among memory cells which are coupled to the unselected bit line.

SUMMARY OF THE INVENTION

Therefore, an object of the invention is to provide an improved configuration of a memory cell array, for a non-volatile semiconductor memory device, which configuration is capable of solving the above-mentioned problems of varying wire resistance and capacitive coupling.

Another object of the invention is to provide a memory cell array configuration for a multi-bit memory device that eases the constraints on design for the layout of sense amplifiers coupled to bit lines while enabling a photolithography process required in the manufacture of the memory device to be easily performed.

Another object of the invention is to provide a memory cell array configuration requiring no additional masking process in the fabrication of string select transistors, and to provide a method for fabricating a memory device having this memory cell array configuration.

Another object of the invention is to provide a memory cell array configuration for a multi-bit memory device capable of preventing a program disturbance phenomenon from occurring in memory cells coupled to unselected bit lines during a programming operation, and to provide a method for fabricating this multi-bit memory device.

Another object of the invention is to provide a memory cell array configuration for a multi-bit memory device capable of obtaining increased bit and source line pitches, thereby reducing a dispersion phenomenon of cell threshold voltages while also reducing a coupling phenomenon occurring between adjacent bit lines.

In accordance with one aspect of the present invention, a non-volatile semiconductor memory device includes a first common source line, a second common source line, a plurality of word lines, and a plurality of bit lines grouped into a first and second bit line group. A memory cell array of the non-volatile semiconductor memory device comprises a plurality of unit strings grouped into first strings belonging to a first string group and second strings belonging to a second string group, with each unit string including a plurality of memory cells for storing data in a non-volatile state. Additionally, each first string is coupled between a bit line of the first bit line group and the first common source line and each second string is coupled between a bit line of the second bit line group and the second common source line. The bit lines and the common source lines are comprised of different conductive layers. In one embodiment, the first bit line group and the first string group are preferably associated with odd bit lines and odd strings, respectively. In this case, the second bit line group and second string group may associated with even bit lines and even strings, respectively.

The present invention also provides a method for driving this memory cell array, comprising the steps of: (A) in a programming operation mode; (1) applying a first-level voltage to a selected bit line, (2) applying a second-level voltage to unselected bit lines, (3) applying a program voltage to a selected word line, (4) applying a pass voltage to unselected word lines, and (5) applying the second-level voltage to the second common source line and the gates of the first select transistors, while (6) applying the first-level voltage to the gates of the second select transistors when the selected bit line belongs to the first bit line group and applying the first-level voltage to the gates of the second select transistors and the second-level voltage to the gates of the first select transistors and the first common source line when the selected bit line belongs to the second bit line group; thereby preventing the memory cells belonging to the strings respectively associated with the unselected bit lines from being programmed.

The preferred method additionally comprises the steps of: (B) in a reading operation mode, (1) applying the first-level voltage to a selected word line and the first and second common source lines, (2) applying a predetermined voltage to the bit lines, and (3) applying a read voltage to the remaining elements of the memory device; thereby preventing a capacitive coupling phenomenon from occurring between adjacent bit lines and allowing cell string current to be normally outputted.

In accordance with another aspect of the present invention, a non-volatile semiconductor memory device includes a plurality of common source lines, word lines and bit lines. A memory cell array of the non-volatile semiconductor memory device, according to this embodiment, comprises a plurality of first select transistors grouped into a primary and secondary select transistor group and a plurality of second select transistors grouped into the primary and secondary select transistor groups. The memory cell array further comprises a plurality of unit strings grouped into first strings belonging to a first string group and second strings belonging to a second string group. Each unit string includes a plurality of memory cells connected in series at channels thereof Each memory cell has a control gate coupled to a word line, a data storage floating gate, a source, and a drain; with the drain being spaced from the source by the channel of the memory cell so that the memory cell stores multi-state data. Additionally, each first string is coupled at one end to the source of an associated first select transistor belonging to the primary select transistor group, the transistor being connected at its drain to an associated bit line. Each first string is coupled at the other end to the drain of an associated second select transistor belonging to the primary select transistor group, which second select transistor is connected at its source to an associated common source line. Each second string is coupled at one end to the source of an associated first select transistor belonging to the secondary select transistor group. The first select transistor of the secondary select transistor group is connected at its drain to the same common source line that is coupled to the associated first string. The other end of each second string is connected to the drain of an associated second select transistor belonging to the secondary select transistor group, the transistor being connected at its source to the bit line that is coupled to the associated first string. In this embodiment, therefore, the first and second strings share one bit line and one common source line with each other. Furthermore, the bit lines and the common source lines are comprised of different conductive layers.

This embodiment of the present invention also provides a method for driving this memory cell array, comprising the steps of: (A) in a programming operation mode, (1) applying a first-level voltage to a selected bit line, (2) applying a second-level voltage to unselected bit lines, (3) applying a program voltage to a selected word line, (4) applying a pass voltage to unselected word lines, and (5) applying the second-level voltage to the common source lines and the gates of the first select transistors, while (6) applying the first-level voltage to the gates of the second select transistors when the selected bit line belongs to the first bit line group and applying the first-level voltage to the gates of the second select transistors and the second-level voltage to the gates of the first select transistors and the common source line when the selected bit line belongs to the second bit line group; thereby preventing the memory cells belonging to the strings respectively associated with the unselected bit lines from being programmed. The present embodiment also comprises the steps of: (B) in a reading operation mode, (1) applying the first-level voltage to a selected word line and the common source lines and (2) applying a predetermined voltage to the bit lines while applying the first-level voltage to the gates of the second select transistors and (3) applying a read voltage to the remaining elements of the memory device only when the selected bit line belongs to the first bit line group; thereby preventing a capacitive coupling phenomenon from occurring between adjacent bit lines and normally outputting cell string current.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
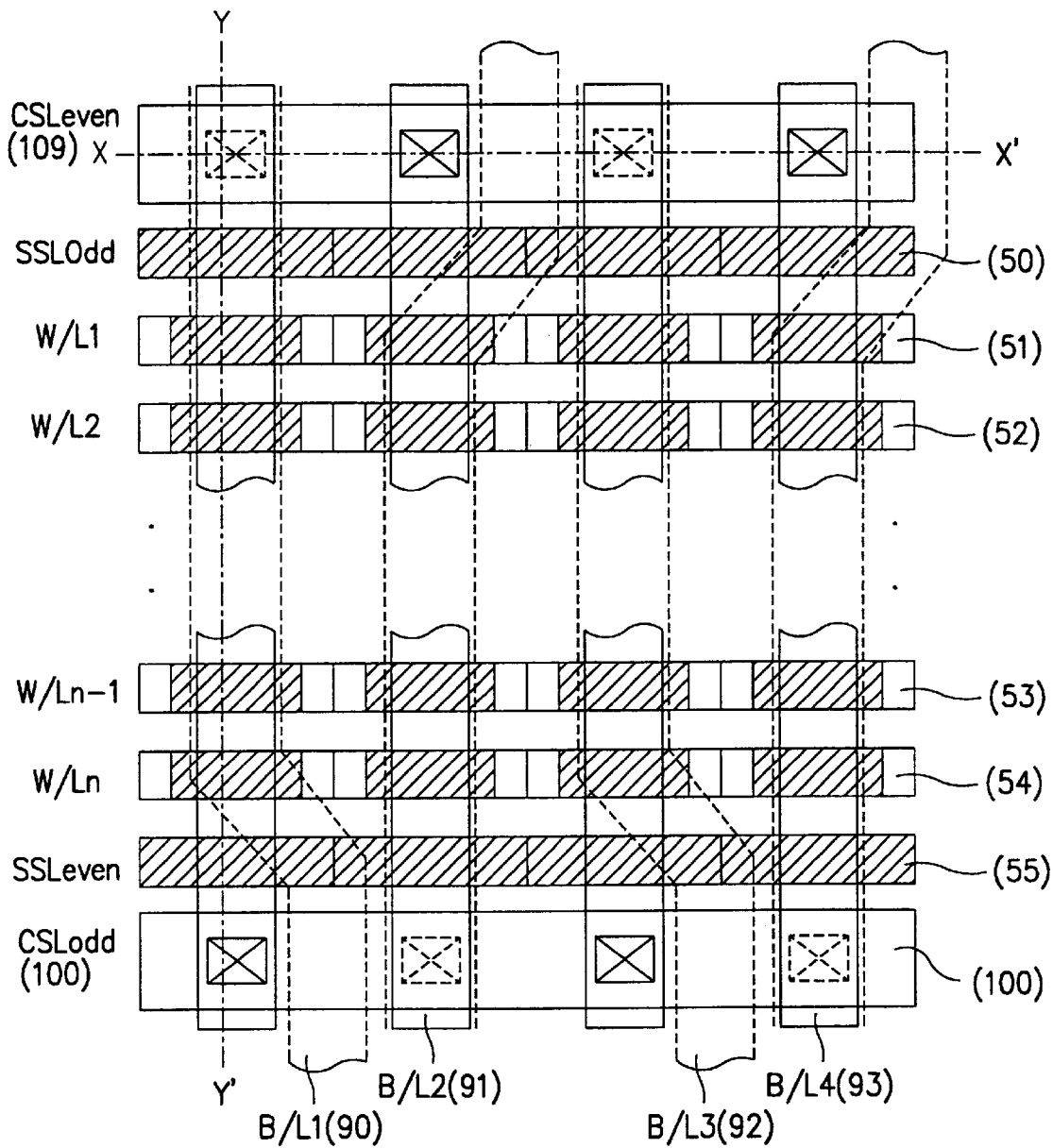
FIG. 1 is a plan view illustrating the layout of a multi-bit memory cell array of a non-volatile semiconductor memory device in accordance with a first embodiment of the present invention.

Referring to FIG. 1, the layout of the cell array of a multi-bit non-volatile semiconductor memory device in accordance with a first embodiment of the present invention is illustrated. In FIG. 1, the reference numerals 50 and 55 denote string select lines. The reference numerals 51, 52, 53 and 54 denote word lines, coupled to memory cells of strings. The reference numerals 100 and 109 denote common source lines. The reference numerals 90, 91, 92 and 93 denote bit lines extending in such a manner that they are substantially orthogonal to the word lines. Each bit line has a split structure. The bit lines are grouped into a first bit line group and a second bit line group. The first bit line group consists of odd bit lines whereas the second bit line group consists of the even bit lines. In the illustrated case, the bit lines 90 and 92 are included in the first bit line group whereas the bit lines 91 and 93 are included in the second bit line group. That is, the first and second bit line groups include alternating bit lines, respectively. The common source line 100, which is arranged at the lower portion of FIG. 1, is a first common source line whereas the common source line 109, which is arranged at the upper portion of FIG. 1, is a second common source line. Conductive layers for the bit lines are made of a conductive material different from that for the common source lines in order to accomplish the desired purposes of the present invention.

Figure 2:
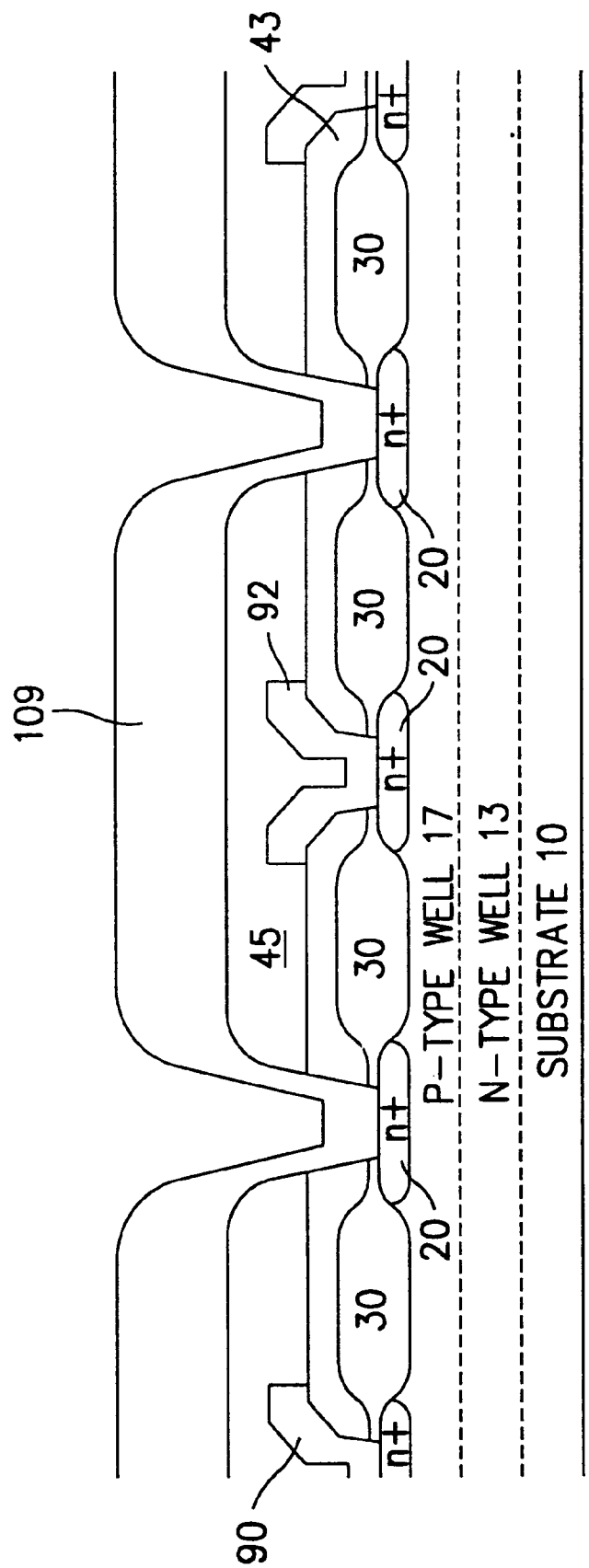
FIG. 2 is a cross-sectional view of the memory cell array of the first embodiment, taken along the line X-X' of FIG. 1.
Figure 3:
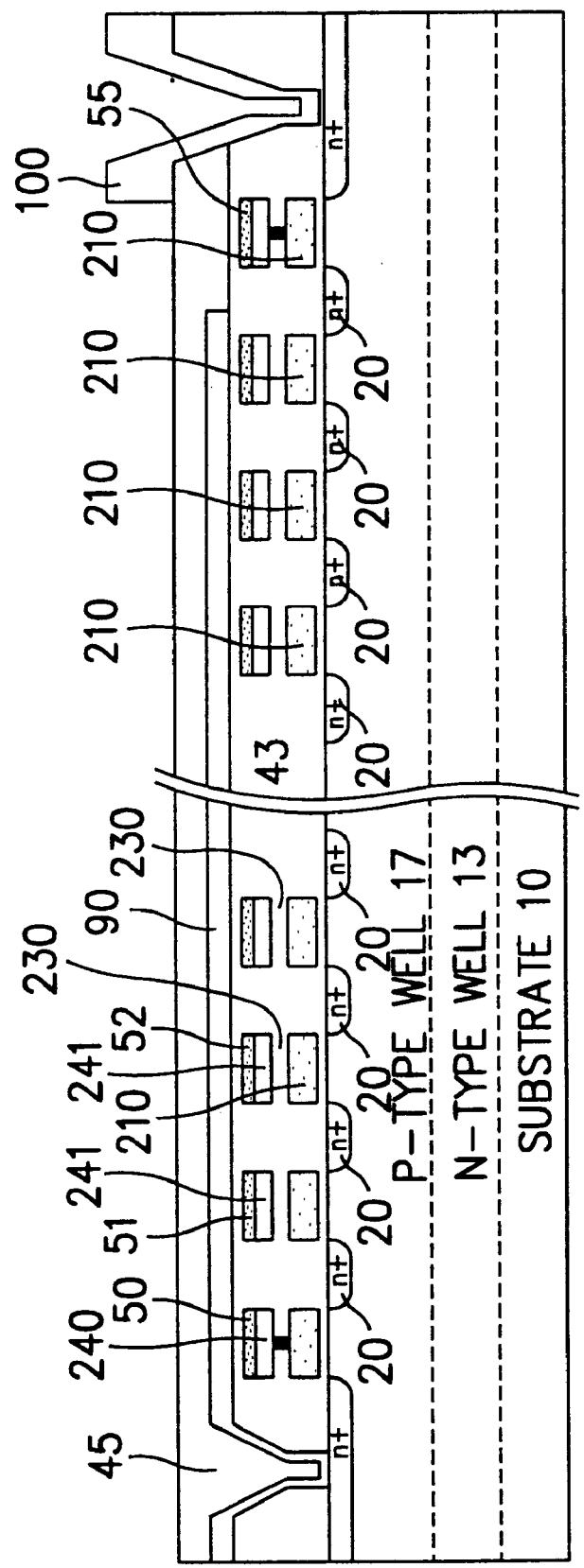
FIG. 3 is a cross-sectional view of the memory cell array of the first embodiment, taken along the line Y-Y' of FIG. 1.

Referring to FIGS. 2 and 3, cross-sectional structures of the cell array shown in FIG. 1 are illustrated. In FIGS. 2 and 3, a P-type substrate 10 is shown, on which an N-type well 13 is formed. A P-type well 17 is formed over the N-type well 13. The P-type well 17 serves as a body region for a multi-state memory cell transistor. On the P-type well 17, a plurality of active regions 20 are formed in such a manner that they are uniformly spaced from one another by an element isolating film 30. Above the active regions 20, gate regions 210 (see FIG. 3) are formed which are called "floating gates". A gate insulating film 230 covers the gate regions 210.

Control gates 241 are disposed on the gate insulating film 230 above the gate regions 210, respectively. The word lines (in FIG. 3, they are denoted by the reference numerals 51 and 52) are disposed over the control gates 241 in such a manner that they are in contact with the control gates 241, respectively. An interlayer insulating film 45 is formed above the bit lines. The common source lines 100 and 109 are disposed on the interlayer insulating film 45. The common source lines 100 and 109 are comprised of a conductive layer different from that of the bit lines 90 to 93. The word lines 51 to 54 are arranged in parallel to one another while being connected between the first and second common source lines 100 and 109.

A pair of string select lines 50 and 55 are arranged adjacent to the first and second common source lines 109 and 100, respectively. The string select lines 50 and 55 extend in parallel to the word lines. First select transistors are coupled at their gates in common to the first string select line 50. The first select transistors are grouped into a primary transistor group and a secondary transistor group. The primary transistor group consists of the odd first select transistors whereas the secondary transistor group consists of the even first select transistors. Similarly, second select transistors are coupled at their gates in common to the second string select lines 55. The second select transistors are grouped into a primary transistor group, which consists of the odd second select transistors, and a secondary transistor group, which consists of the even second select transistors. In other words, the primary select transistor group consists of the odd first select transistors and the odd second select transistors whereas the secondary select transistor group consists of the even first select transistors and the even second select transistors. The insulating film 230 is comprised of a film having an O/N/O structure consisting of layers respectively containing oxygen ions, nitrogen ions and oxygen ions to provide a superior insulation property. The conductive layer adapted to form the bit lines 90 and 93 is made of polysilicon or polycide exhibiting a superior step coverage for contacts. In this case, the conductive layer preferably has a thickness of about 3,000 Å or less to obtain a reduced bit line capacitance.

The conductive layer adapted to form the first and second source lines 109 and 100 is made of a metal material exhibiting a low sheet resistance. In this case, the metal material is preferably an aluminum-based material. For example, the conductive layer of the first and second common source lines may be comprised of an aluminum layer or a laminated layer consisting of an aluminum layer and a titanium nitride layer. The conductive layer for the source lines preferably has a thickness of about 6,000 to 8,000 Å. The interlayer insulating film 45 serves to insulate the conductive layer serving as the bit lines 90 to 93 and the conductive layer serving as the common source lines 100 and 109 from each other. The interlayer insulating film 45 may be comprised of a thermal oxide film such as an HTO or BPSG film exhibiting a resistance to high temperature. In the above-mentioned cell array according to the present invention, the distance between bit and source lines increases to two times those in conventional cell arrays. Since the pitch between bit and source lines doubles, it is possible to achieve a convenient design for the layout of sense amplifiers coupled to bit lines while providing an easy photolithography process, as required in the manufacture of memory device. On the other hand, the string select transistors are comprised of enhanced NMOS transistors. Accordingly, it is unnecessary to perform a masking process in the fabrication of the string select transistors. It is also possible to prevent a coupling occurring between adjacent bit lines during a read operation by virtue of an appropriate arrangement of the common source lines.

Figure 4:
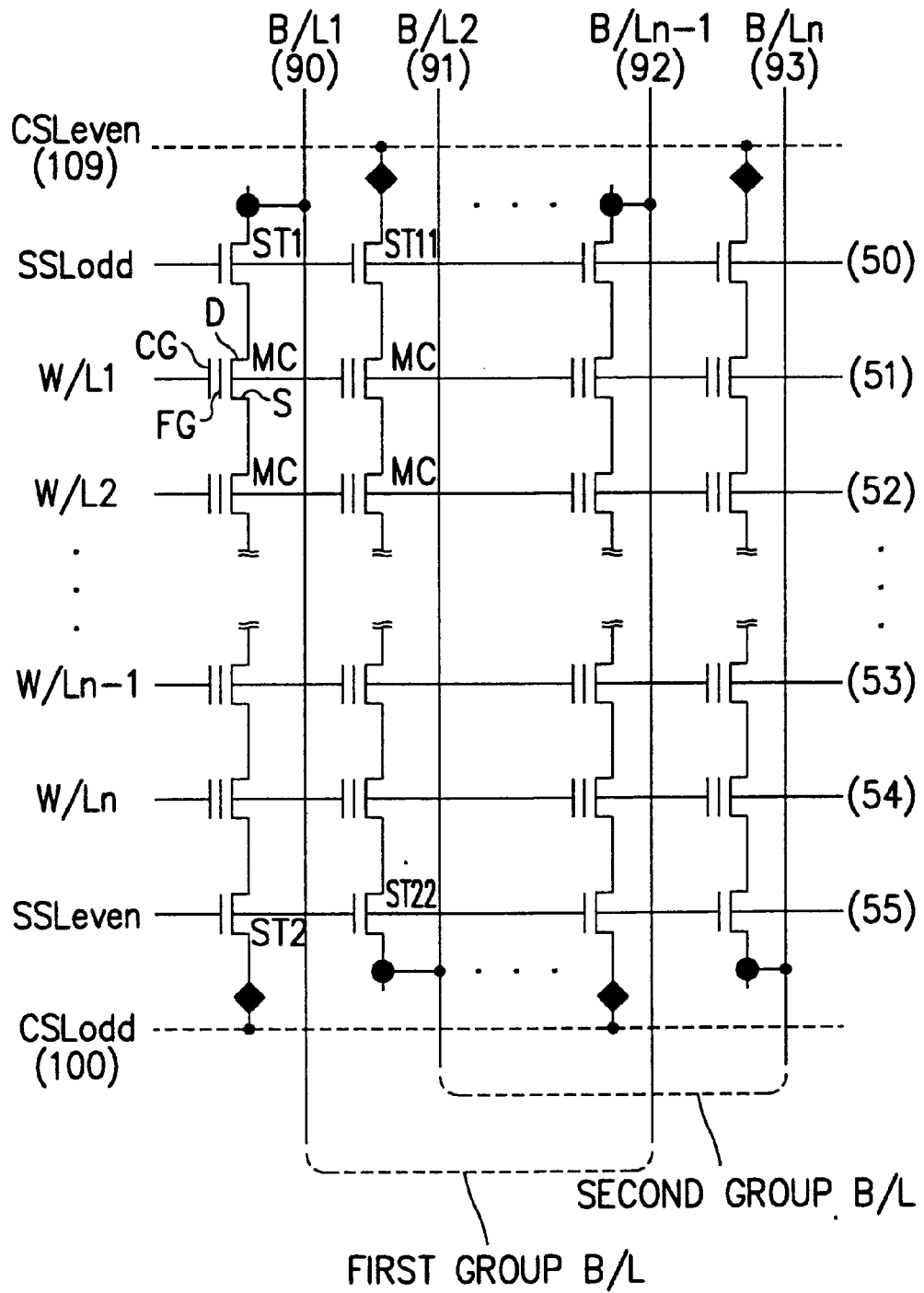
FIG. 4 is a schematic circuit diagram illustrating an equivalent circuit of the memory cell array of the first embodiment, shown in FIG. 1.

FIG. 4 illustrates an equivalent circuit of the cell array shown in FIGS. 1 to 3. A detailed configuration of the cell array and a method for driving the cell array will now be described in conjunction with FIG. 4. As shown in FIG. 4, the cell array includes a plurality of bit lines (in FIG. 4, only the bit lines 90 to 93 are shown) which are grouped into two groups in an alternating manner. The odd bit lines, which are denoted (by way of example) by the reference numerals 90 and 92, belong to the first bit line group whereas the even bit lines, which are denoted (by way of example) by the reference numerals 91 and 93, belong to the second bit line group. The bit lines of the first and second bit line groups are formed in parallel to one another by the conductive layer deposited over the semiconductor substrate, as mentioned above. Strings are connected to the bit lines via select transistors ST, respectively. The strings are grouped into two groups in an alternating manner. Each string includes a plurality of serial-connected memory cells MC. Each string belonging to the first string group is coupled at one end thereof to the source of an associated first select transistor belonging to the primary select transistor group (i.e., the select transistor ST1), which transistor is connected at its drain to an associated bit line belonging to the first bit line group (i.e., the bit line 90 or 92). At the other end, each string belonging to the first string group is coupled to the drain of an associated second select transistor belonging to the primary select transistor group (i.e., the select transistor ST2), which transistor is connected at its source to the first common source line 100 comprised of a conductive layer different from that of the bit lines. Each string belonging to the second string group is coupled at one end thereof to the source of an associated first select transistor belonging to the secondary select transistor group (i.e., the select transistor ST11), which transistor is connected at its drain to the second common source line 109 comprised of the same conductive layer as that of the first common source line 100 while being spaced from the first common source line 100. At the other end, each string belonging to the second string group is coupled to the drain of an associated second select transistor belonging to the secondary select transistor group (i.e., the select transistor ST22), which transistor is connected at its source to an associated bit line belonging to the second bit line group (for example, the bit line 91 or 93). In order to store multi-state data, each memory cell MC has a control gate CG coupled to an associated word line, a data storage floating gate FG, a source S and a drain D. The source S and drain D of each memory cell MC are spaced from each other by a channel formed on the semiconductor substrate. In order to drive the cell array having the configuration shown in FIG. 4, a drive control unit (not shown) is coupled to the string select lines 50 and 55 respectively connected to the gates of the first and second select transistors (i.e., select transistors ST1, ST11, ST2 and ST22). The drive control unit is also coupled to the word lines 51 to 54. In an operation mode such as a programming, erasing, reading or verifying mode, the drive control unit applies a predetermined voltage to the first and second common source lines and selects a desired bit line group and at least one word line. The drive control unit also applies a voltage associated with the operation mode to the control gates of the memory cells coupled to the selected word line. Thus, the drive control unit achieves desired operations for the one-bit or multi-bit NAND flash memory.

Now, the control operation of the drive control unit will be described in conjunction with each operation mode. In a programming operation mode, a first-level voltage is applied to a selected bit line whereas a second-level voltage is applied to unselected bit lines. In this mode, a program voltage is applied to a selected word line whereas a pass voltage is applied to unselected word lines. Where the selected bit line belongs to the first bit line group, the second-level voltage is applied to the second common source line and the gates of the first select transistors. In this case, the first-level voltage is applied to the gates of the second select transistors. On the other hand, where the selected bit line belongs to the second bit line group, the second-level voltage is applied to the first common source line and the gates of the second select transistors. In this case, the first-level voltage is applied to the gates of the first select transistors. Thus, the memory cells belonging to the strings respectively associated with the unselected bit lines are prevented from being programmed.

In a reading operation mode, the first-level voltage is applied to a selected word line and the first and second common source lines whereas a predetermined voltage is applied to the bit lines. In this case, a read voltage is applied to the remaining elements. In accordance with such a controlled voltage application, it is possible to prevent a capacitive coupling phenomenon from occurring between adjacent bit lines. In this case, accordingly, cell string current is normally output. Here, the first-level voltage is voltage having a ground voltage level whereas the second-level voltage is voltage having a supply voltage level. The program voltage has a voltage level higher than the pass voltage whereas the pass voltage has a voltage level higher than the supply voltage level.

In an erasing operation mode, the ground-level voltage is applied to only a selected word line. The remaining elements are maintained in a floating state. In this case, an erase voltage of about 20 V is applied to the substrate in order to achieve an erasing operation for every page or a flash erasing operation.

Figure 5:
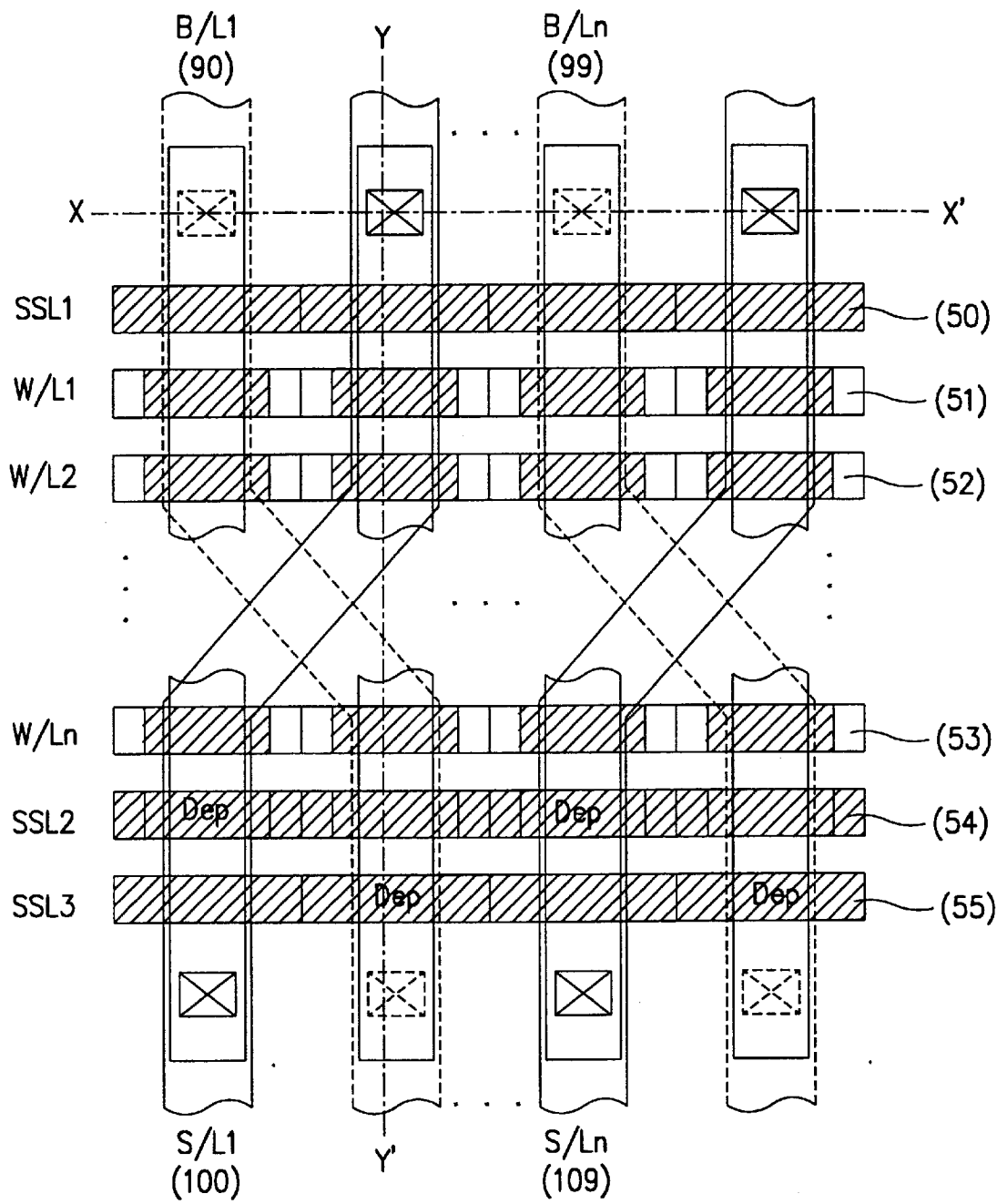
FIG. 5 is a plan view illustrating the layout of a multi-bit non-volatile memory cell array of a semiconductor memory device in accordance with a second embodiment of the present invention.
Figure 6:
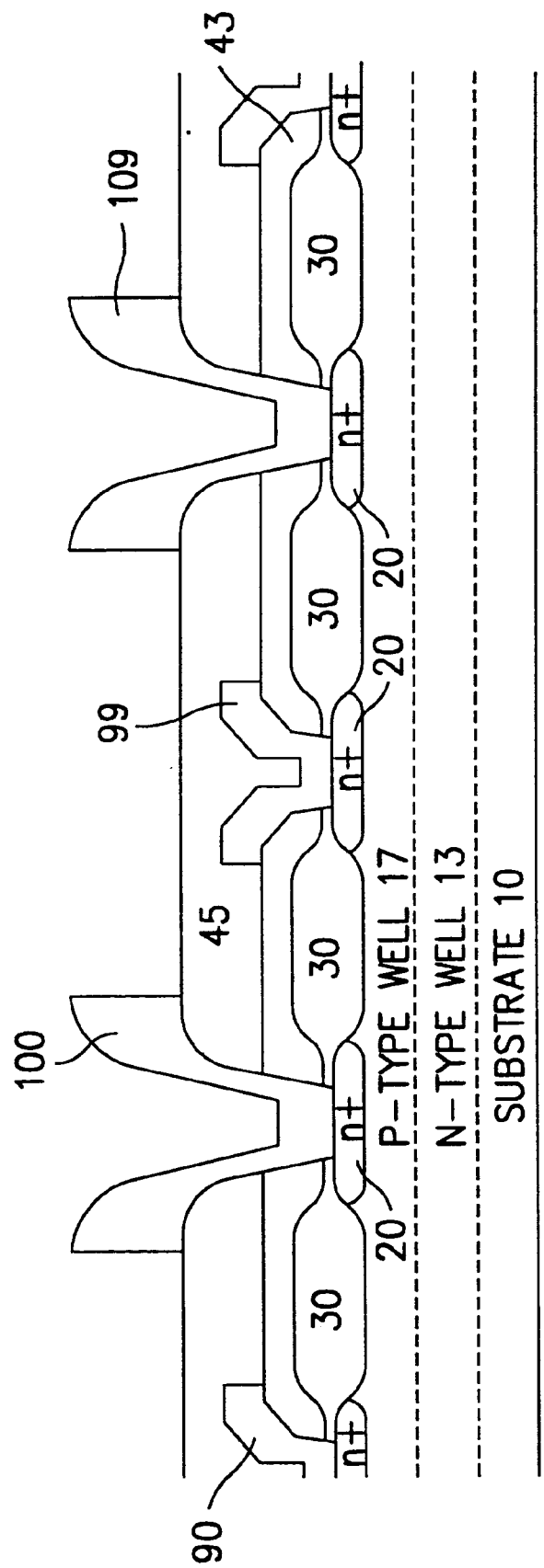
FIG. 6 is a cross-sectional view of the memory cell array of the second embodiment, taken along the line X-X' of FIG. 5.
Figure 7:
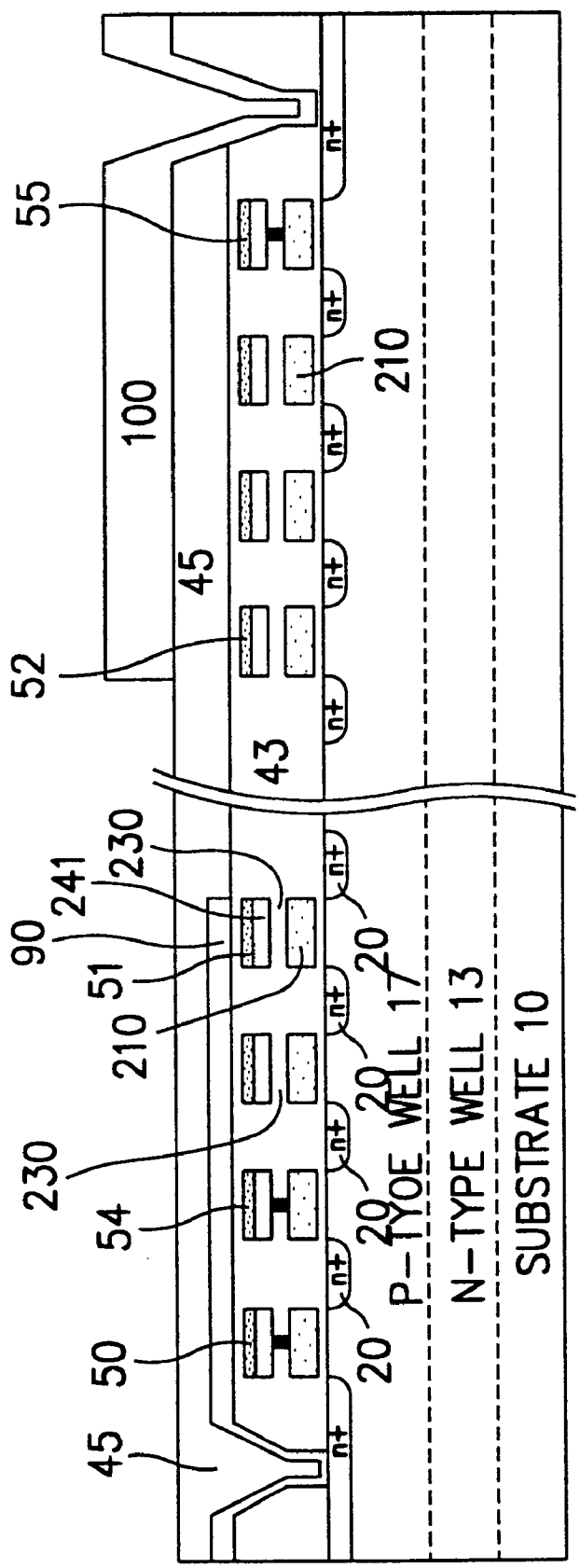
FIG. 7 is a cross-sectional view of the memory cell array of the second embodiment, taken along the line Y-Y' of FIG. 5.
Figure 8:
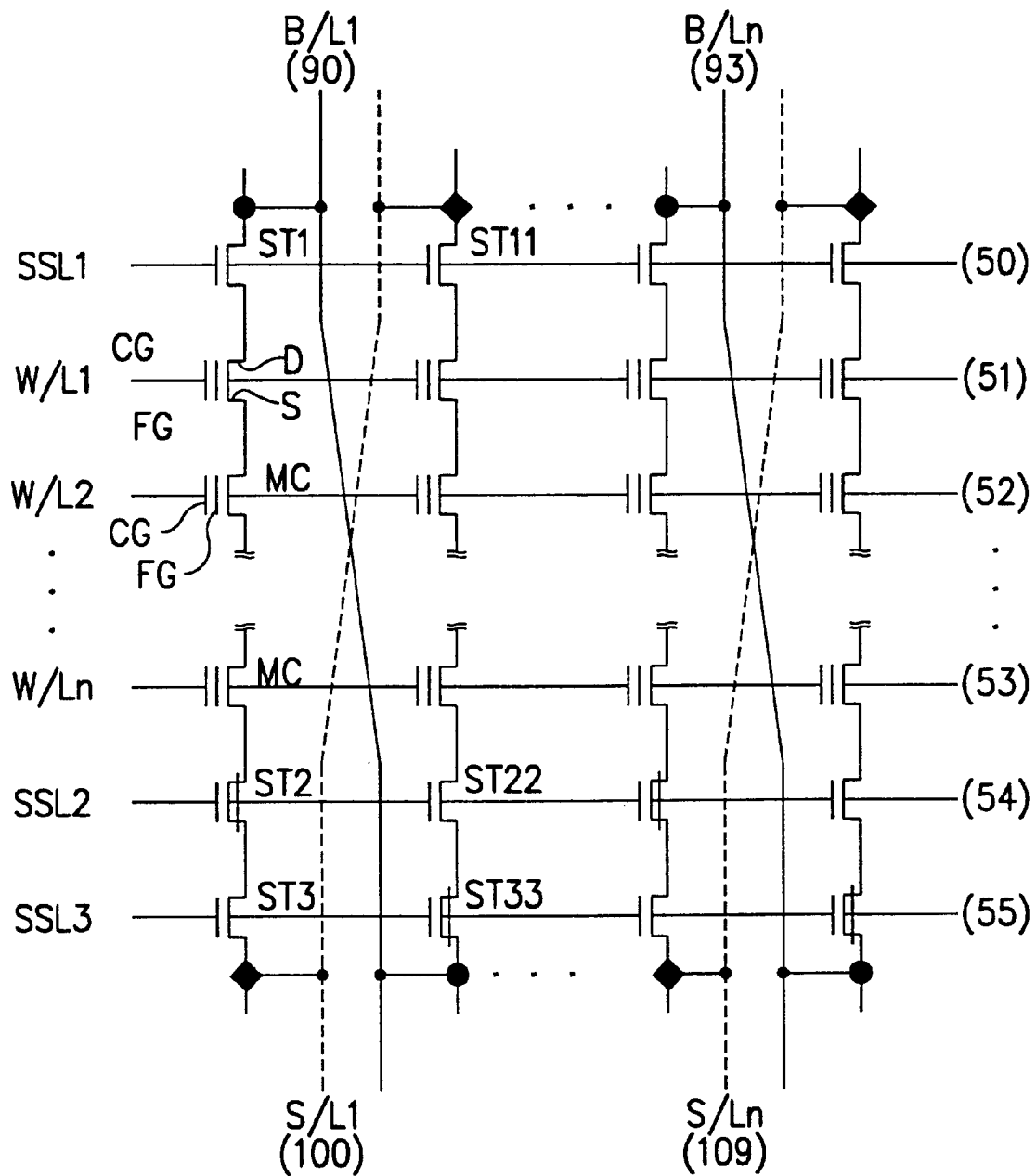
FIG. 8 is a schematic circuit diagram illustrating an equivalent circuit of the memory cell array of the second embodiment shown in FIG. 5.

Referring to FIGS. 5 through 8, a second embodiment of the present invention will now be described in detail. The second embodiment is characterized by a configuration wherein bit lines are formed in a crossing manner using a conductive layer different from that of common source lines. In this configuration, two strings share one bit line and one common source line with each other. FIG. 5 illustrates the layout of the cell array of a multi-bit non-volatile semiconductor memory according to the second embodiment of the present invention. FIG. 6 is a cross-sectional view of the cell array of this embodiment taken along the line X-X', whereas FIG. 7 is taken along the line Y-Y', of FIG. 5. FIG. 8 illustrates an equivalent circuit of the cell array shown in FIG. 5. In FIG. 5, the reference numerals 50, 54 and 55 denote string select lines SSL-1, SSL-2 and SSL-3, respectively. The reference numerals 51, 52 and 53 denote word lines coupled to memory cells of strings, respectively. The reference numerals 100 and 109 denote common source lines, respectively. In addition, the reference numerals 90 and 99 denote bit lines extending in such a manner that they are substantially orthogonal to the word lines, respectively. The bit lines have a crossing arrangement so that each bit line is shared by two strings. Conductive layers for the bit lines are made of a conductive material different from that for the common source lines in order to accomplish the desired purposes of the present invention.

Referring to FIGS. 6 and 7, a P-type substrate 10 is shown, on which an N-type well 13 is formed. A P-type well 17 is formed over the N-type well 13. The P-type well 17 serves as a body region for a multi-state memory cell transistor. On the P-type well 17, a plurality of active regions 20 are formed in such a manner that they are uniformly spaced from one another by an element isolating film 30. Above the active regions 20, gate regions 210 are formed which are called "floating gates". A gate insulating film 230 covers the gate regions 210. Control gates 241 are disposed on the gate insulating film 230 above the gate regions 210, respectively. The word lines (in FIG. 7, they are denoted only by the reference numerals 51 and 52) are disposed over the control gates 241 in such a manner that they are in contact with the control gates 241, respectively. An interlayer insulating film 45 is formed above the bit lines 90 and 99. The common source lines 100 and 109 are disposed on the interlayer insulating film 45. The common source lines 100 and 109 are comprised of a conductive layer different from that of the bit lines 90 to 93. The word lines 51 to 53 shown in FIG. 5 are arranged in parallel to the string select lines 50, 54 and 55. Select transistors are coupled at their gates in common to each string select line. The string select lines 50, 54 and 55 are arranged in the vicinity of both side edges of the word lines. The insulating film 230 shown in FIG. 7 is comprised of a film having an O/N/O structure consisting of layers respectively containing oxygen ions, nitrogen ions and oxygen ions to provide a superior insulation property. The conductive layer adapted to form the bit lines 90 and 99 is made of polysilicon or polycide exhibiting a superior step coverage for contacts. In this case, the conductive layer preferably has a thickness of about 3,000 Å or less to obtain a reduced bit line capacitance. The conductive layer adapted to form the common source lines 100 and 109 is made of a metal material exhibiting a low sheet resistance. In this case, the metal material is preferably an aluminum-based material. For example, the conductive layer of the first and second common source lines may be comprised of an aluminum layer or a laminated layer consisting of an aluminum layer and a titanium nitride layer. The conductive layer for the common source lines preferably has a thickness of about 6,000 to 8,000 Å. The interlayer insulating film 45 serves to insulate the conductive layer serving as the bit lines 90 and 99 and the conductive layer serving as the common source lines 100 and 109 from each other. The interlayer insulating film 45 may be comprised of a thermal oxide film such as an HTO or BPSG film exhibiting a resistance to high temperature. In the above-mentioned cell array according to the present invention, the distance between bit and source lines increases to two times those in conventional cell arrays. Since the pitch between bit or source lines doubles, it is possible to achieve a free design for the layout of sense amplifiers coupled to bit lines which is easily manufactured using a photolithography process, as required in the manufacture of memory devices. On the other hand, the string select transistors are comprised of enhanced NMOS transistors. Accordingly, it is unnecessary to perform a masking process in the fabrication of the string select transistors. It is also possible to prevent coupling from occurring between adjacent bit lines during a read operation by virtue of an appropriate arrangement of the common source lines.

A detailed configuration of the cell array shown in FIGS. 5 to 7 and a method for driving the cell array will now be described in conjunction with FIG. 8. As shown in FIG. 8, the cell array includes a plurality of strings which are grouped into two groups in an alternating manner. Each string includes a plurality of memory cells connected in series at their drainsource channels. Adjacent strings are coupled in common to one bit line via associated select transistors of the string select lines SSL1 to SSL3. The select transistors are grouped into first transistors coupled to the first string select line SSLI, second transistors coupled to the second string select line SSL2 and third transistors coupled to the third string select line SSL3. The select transistors, coupled to each string select line, are also grouped into a primary select transistor group and a secondary select transistor group. In other words, the primary select transistor group consists of odd first to the third select transistors whereas the secondary select transistor group consists of even first to the third select transistors. Each first string belonging to the first string group is coupled at one end thereof to the source of an associated first select transistor belonging to the primary select transistor group (i.e., the select transistor ST1), which transistor is connected at its drain to an associated common bit line (i.e., the bit line 90). At the other end, each first string is coupled to the drain of an associated second select transistor belonging to the primary select transistor group (i.e., the select transistor ST2), which transistor is connected at its source to an associated common source line (i.e., the common source line 100) via an associated third select transistor belonging to the primary select transistor group (i.e., the select transistor ST3). On the other hand, each second string belonging to the second string group is coupled at one end thereof to the source of an associated first select transistor belonging to the secondary select transistor group (i.e., the select transistor ST11), which transistor is connected at its drain to the common source line 100 coupled to the associated first string. At the other end, each second string is coupled to the drain of an associated second select transistor belonging to the secondary select transistor group (i.e., the select transistor ST22), which transistor is connected at its source to the common bit line 90, which is coupled to the associated first string via an associated third select transistor belonging to the secondary select transistor group (i.e., the select transistor ST33). In order to store multi-state data, each memory cell MC has a control gate CG coupled to an associated word line, a data storage floating gate FG, a source S and a drain D. The source S and drain D of each memory cell MC are spaced from each other by the channel of the memory cell. The bit lines are comprised of a conductive layer different from those of the common source lines. As mentioned above, the cell array has a configuration in which two adjacent strings, namely, adjacent first and second strings, share one bit line and one common source line with each other. In the illustrated case, the first string of adjacent strings is that arranged on the left of an associated bit line, whereas the second string is that arranged on the right of the associated bit line. In addition, the bit lines are grouped into a first bit line group and a second bit line group in an alternating manner.

In order to drive the cell array having the configuration shown in FIG. 8, a drive control unit (not shown) is coupled to the string select lines 50, 54 and 55 and the word lines 51 to 53. In an operation mode, such as a programming, erasing, reading, or verifying mode, the drive control unit applies a predetermined voltage to the common source lines, and selects a desired bit line group and at least one word line. The drive control unit also applies a voltage associated with the operation mode to the control gates of the memory cells coupled to the selected word line. Thus, the drive control unit achieves desired operations for the one-bit or multi-bit NAND flash memory.

Now, the control operation of the drive control unit will be described in conjunction with each operation mode. In a programming operation mode, a second-level voltage is applied to the common source lines. Where the selected bit line belongs to the first bit line group, each bit line of the second bit line group is electrically shielded from the common source lines and selected bit line. On the other hand, where the selected bit line belongs to the second bit line group, each bit line of the first bit line group is electrically shielded from the common source lines and selected bit line. Thus, the memory cells belonging to the strings respectively associated with the unselected bit lines are prevented from being programmed.

In a reading operation mode, a first-level voltage is applied to a selected word line and the common source lines. Where the selected bit line belongs to the first bit line group, each bit line of the second bit line group is electrically shielded from the common source lines. On the other hand, where the selected bit line belongs to the second bit line group, each bit line of the first bit line group is electrically shielded from the common source lines. Thus, it is possible to prevent a capacitive coupling phenomenon from occurring between adjacent bit lines. In this case, accordingly, cell string current output is normal.

In an erasing operation mode, the ground-level voltage is applied to only a selected word line. The remaining elements are maintained in a floating state. In this case, an erase voltage is applied to the substrate in order to achieve an erasing operation for every page or a flash erasing operation.

In the above-mentioned cell array according to the present invention, the layout pitch of bit lines increases to two times that of conventional cell arrays. Accordingly, it is possible to achieve a free design for the layout of sense amplifiers coupled to bit lines while providing a photolithography process easily capable of manufacturing of memory devices. The present invention also provides an effect of requiring no masking process in the fabrication of string select transistors. In accordance with the present invention, it is also possible to solve a decrease in string current occurring in a reading operation. The present invention also provides a memory cell array configuration for a multi-bit memory device capable of preventing a program disturbance phenomenon from occurring in memory cells coupled to unselected bit lines in a programming operation. Since increased bit and source line pitches can be obtained, it is also possible to eliminate a dispersion phenomenon of cell threshold voltages while also eliminating a coupling phenomenon occurring between adjacent bit lines.

Although the preferred embodiments of the invention have been disclosed for illustrative purposes, those skilled in the art will appreciate that various modifications, additions and substitutions arc possible, without departing from the scope and spirit of the invention as disclosed in the accompanying claims.

What is claimed is:

1. A non-volatile semiconductor memory cell array comprising:
   a first group of units strings;
   a second group of unit strings, wherein the second group of units is arranged substantially in parallel with the first group of units strings such that strings from the first group alternate with strings from the second group;
   a second common source line arranged substantially orthogonal to the unit strings and coupled to each unit string of the second group of unit strings;
   a first group of bit lines arranged substantially in parallel with the unit strings, wherein each bit line of the first group of bit lines is coupled to a corresponding unit string of the first group of unit strings;
   a second group of bit lines arranged substantially in parallel with the unit strings, wherein each bit line of the second group of bit lines is coupled to a corresponding unit string of the second group of unit strings;
   wherein the bit lines are formed on a different level than the common source lines.

2. A memory cell array according to claim 1 wherein:
   each unit string has a first end at a first side of the memory cell array and a second end at a second side of the memory cell array opposite the first side;
   the first and second common source lines are arranged along the first and second sides of the memory cell array, respectively;
   the first end of each unit string of the first group of unit strings is coupled to the first common source line; and
   the second end of each unit string of the second group of unit strings is coupled to the second common source line.

3. A memory cell array according to claim 2 wherein:
   each bit line of the first group of bit lines is coupled to the second end of a corresponding unit string of the first group of unit strings; and
   each bit line of the second group of bit lines is coupled to the first end of a corresponding unit string of the second group of unit strings.

* * * * *

UNITED STATES PATENT AND TRADEMARK OFFICE
CERTIFICATE OF CORRECTION

PATENT NO. : 6,118,696  
DATED : September 12, 2000  
INVENTOR(S) : Choi

It is certified that error appears in the above-identified patent and that said Letters Patent is hereby corrected as shown below:

Column 7,  
Line 21, "arc" should read -- are --.

Column 10,  
Line 46, "typc" should read -- type --.  
Line 58, "arc" should read -- are --.

Column 11,  
Line 50, "SSLI" should read -- SSL1 --.

Column 13,  
Line 28, "arc" should read -- are --.  
Line 36, "units" should read -- unit strings --.

Column 14,  
Line 1, "units strings" should read -- unit strings --.  
Between lines 2 and 3, add: -- a first common source line arranged substantially orthogonal to the unit strings and coupled to each unit string of the first group of unit strings; --.

Signed and Sealed this

Thirteenth Day of August, 2002

Attest:

JAMES E. ROGAN  
Attesting Officer     Director of the United States Patent and Trademark Office